United States Patent
Vashchenko et al.

(10) Patent No.: US 7,911,869 B1
(45) Date of Patent: Mar. 22, 2011

(54) FUSE-TYPE MEMORY CELLS BASED ON IRREVERSIBLE SNAPBACK DEVICE

(75) Inventors: Vladislav Vashchenko, Palo Alto, CA (US); Peter J. Hopper, San Jose, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 658 days.

(21) Appl. No.: 11/198,688

(22) Filed: Aug. 5, 2005

(51) Int. Cl.
- *G11C 17/14* (2006.01)
- *G11C 17/18* (2006.01)
- *G11C 17/08* (2006.01)
- *H01H 37/76* (2006.01)
- *H01H 85/00* (2006.01)

(52) U.S. Cl. ....... 365/225.7; 365/96; 365/103; 365/104; 327/525

(58) Field of Classification Search .................... 365/96, 365/71, 200, 159, 104, 103, 225.7; 257/530, 257/50, 209, 529; 438/467, 600, 601; 327/525, 327/580

See application file for complete search history.

(56) References Cited

U.S. PATENT DOCUMENTS

| | | | | |
|---|---|---|---|---|
| 5,019,878 A * | 5/1991 | Yang et al. | ..................... | 257/390 |
| 5,163,180 A * | 11/1992 | Eltoukhy et al. | .............. | 257/530 |
| 5,298,784 A * | 3/1994 | Gambino et al. | ............. | 257/529 |
| 5,672,994 A * | 9/1997 | Au et al. | ......................... | 327/525 |
| 6,188,255 B1 * | 2/2001 | Mann | ............................. | 327/113 |
| 6,229,733 B1 * | 5/2001 | Male | ......................... | 365/185.18 |
| 6,304,100 B1 * | 10/2001 | Kobayashi | ....................... | 326/40 |
| 6,836,000 B1 * | 12/2004 | Marr et al. | ..................... | 257/530 |
| 7,071,533 B1 * | 7/2006 | Kimber et al. | ................. | 257/529 |
| 7,157,782 B1 * | 1/2007 | Shih et al. | ...................... | 257/530 |
| 2006/0160318 A1 * | 7/2006 | Schulte et al. | ................. | 438/351 |

* cited by examiner

*Primary Examiner* — J. H. Hur
(74) *Attorney, Agent, or Firm* — Jurgen K. Vollrath; Vollrath & Associates

(57) ABSTRACT

In a programmable circuit making use of fuse cells, a snapback NMOS or NPN transistor or SCR without reversible snapback capability is used as an anti-fuse, and programming comprises biasing the control electrode of the transistor to cause the transistor to go into snapback mode.

9 Claims, 1 Drawing Sheet

FUSE-TYPE MEMORY CELLS BASED ON IRREVERSIBLE SNAPBACK DEVICE

FIELD OF THE INVENTION

The invention relates to the programming of circuit blocks that need to be programmed once only. In particular it relates to the field of fuse cells.

BACKGROUND OF THE INVENTION

For a number of analog applications a programmable block is required, e.g., in the case of a programmable I/O.

One approach that has been adopted in the past is the use of EEPROM cells. The disadvantage of EEPROMs, however, is that they require additional complex programming circuitry and also consume a substantial amount of space.

An alternative that has been used in the past in cases where the block needs to be programmed only once, is to make use of fuses. These fuse cells, in contrast to EEPROM cells provide a close to minimum dimension poly resistor. However, they are programmed by burning the fuse cell out using a CMOS switch circuit. In the case of on-chip programming, this requires a rather complex pulsed switch circuit and a sophisticated process to ensure reliable burn out of the fuse cell.

The present application seeks to provide another solution to the problem.

SUMMARY OF THE INVENTION

According to the invention, there is provided an anti-fuse type fuse cell based on an irreversible snapback device such as an NMOS or NPN bipolar transistor or SCR. In particular, the fuse cell includes an NMOS, NPN or SCR that has snapback capability but where the snapback is irreversible, and which is connected between the power supply (VDD) and ground to create a current path to ground prior to programming, and a high resistance path to ground after programming. Typically, prior to programming, the control electrode of the device is connected to a potential that avoids the device being pushed into snapback mode. For purposes of programming, the control electrode is connected to a high enough potential, e.g. VDD, to cause the device to go into snapback mode.

Further, according to the invention, there is provided a method of providing an programmable circuit, comprising providing a snapback NMOS or NPN or SCR device that is not capable of reversible snapback, connecting the device between a power supply (VDD) and ground, and controlling the control electrode bias to cause the device to go into snapback mode. The control electrode may be connected to a high voltage such as VDD to cause it to go into snapback mode. Preferably the high voltage to the control electrode is applied as a pulse. The device may be connected to VDD through a resistor to provide a low output while the device is in a conductive state, and a high output once the device has gone into irreversible snapback mode. The output may be connected to an inverter to provide an inverted, buffered output.

DETAILED DESCRIPTION OF THE INVENTION

Figure 1:
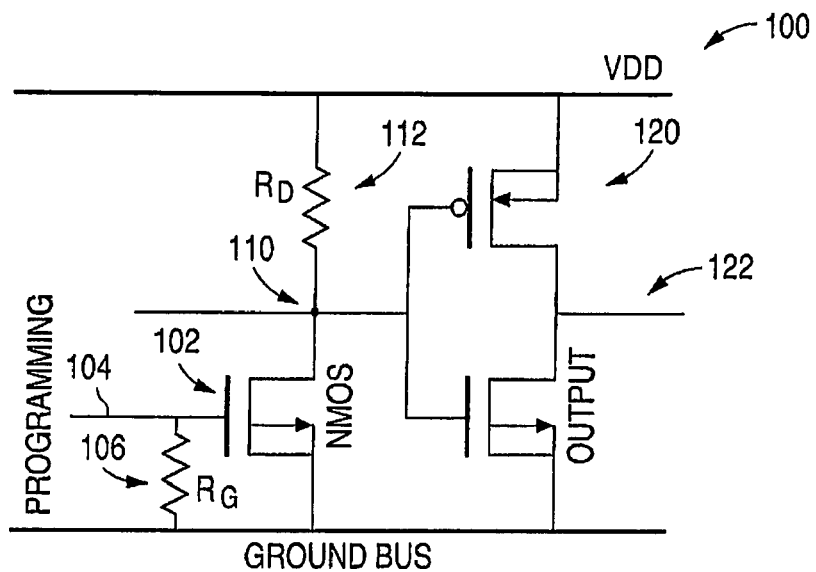
FIG. 1 is one embodiment of a programmable circuit of the invention.

FIG. 1 shows one embodiment of a programmable circuit of the invention.

The circuit 100 is based on the use of a snapback transistor 102 that burns out when forced into snapback mode. In other words it is a snapback device without reversible snapback capability. The snapback of the device is controlled by controlling the bias of the control electrode 104. In this embodiment, the transistor 102 is an NMOS transistor and the control electrode 104 is the gate of the NMOS transistor 102. However, an NPN bipolar transistor could be used in place of the NMOS 102, in which case the base of the device would be the control electrode that would be biased to control the snapback of the device. It will also be appreciated that the circuit could be reconfigured to make use of an SCR instead. In each case the control electrode bias is controlled to cause the device to go into snapback mode. The high voltage electrode (drain or collector) which is connected to the high voltage rail will be referred to generically as the anode.

In the present case, prior to programming, the gate 104 is connected to ground through the resistor 106, thereby maintaining the gate 104 at a low potential that turns the NMOS transistor off, thereby providing a low leakage path. This pulls node 110 high since it is connected to VDD through resistor 112. Since the node 110 is connected to an inverter 120, the output 122 will be low prior to programming. In other words, the circuit is pre-programmed to "0". The NMOS 102 is programmed to "1" by connecting the gate 104 to the power rail (VDD), which causes the NMOS 102 to go into irreversible snapback and burn out. This creates a low resistance (100Ω-1 kΩ) leakage path to ground, thereby pulling the node 110 low and causing the output 122 to go high. VDD is typically applied to the control gate 104 as a pulse, whereafter the gate 114 returns to its pre-program state. However, since the NMOS burns out during snapback, it remains in a low resistance state and leaves the output 122 as a high. The advantage of this circuit is that even if the programming fails the first time, a high voltage pulse can simply be applied to the gate again.

Figure 2:
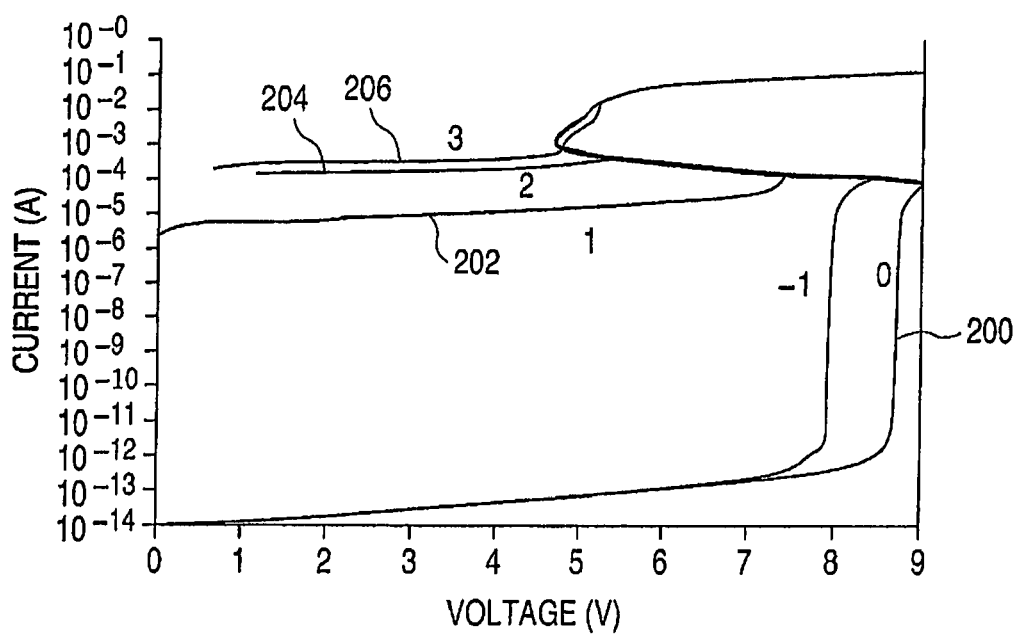
FIG. 2 is a set of V-I curves for an NMOS transistor under different gate bias conditions.

FIG. 2 shows the typical drain-source voltage to current characteristics for an NMOS under different gate bias conditions. Without gate bias, curve 200 shows the device snapping back at about 8.7V. With a gate bias of 1V (curve 202), the snapback voltage is reduced to about 7.5 V. At gate bias voltages of 2V (curve 204) and 3V (curve 206), the snapback occurs at about 5V and 4.5V, respectively.

As mentioned above, in the case of an NPN transistor the circuit is much the same as in FIG. 1, but the high voltage pulse is applied to the base of the transistor. In the case of an SCR, the high voltage pulse is applied to the gate of the device.

What is claimed is:

1. An anti-fuse type device for selectively providing an inverter that has an input connected to an input voltage that lies between an operating voltage supply (VDD) and ground, with a low resistance path to ground, the device comprising an irreversible snapback device having a gate or base control electrode formed between an anode and a cathode of the device, wherein the anode is connected to the operating voltage supply (VDD) through a resistor, the operating voltage supply (VDD) through the resistor being used both during programming of the device and during normal operation of the device after programming of the device, and the device being connected between the inverter input and ground, in which the gate or base control electrode of the device is connected during programming to a bias voltage higher than ground potential that is sufficiently high to cause the device to go into snapback mode.

2. An anti-fuse type device of claim 1, wherein the device is an NMOS or NPN transistor or SCR.

3. An anti-fuse type device of claim 1, wherein prior to programming, the gate or base control electrode of the device is connected to a potential that avoids the device being pushed into snapback mode.

4. An anti-fuse type device of claim 1, wherein for purposes of programming, the gate or base control electrode of the device is connected to VDD.

5. A method of providing a programmable circuit, comprising
providing an irreversible snapback NMOS or NPN or SCR device that is not capable of reversible snapback, and includes a gate or base control electrode formed between an anode and a cathode of the device,
connecting the device between a power supply at an operating supply voltage (VDD) and ground, and
programming the device to form a permanently low resistance device by controlling a bias of the gate or base control electrode of the device to cause the device to go into snapback mode, wherein the anode is connected to the operating supply voltage (VDD) through a resistor, the operating supply voltage (VDD) through the resistor being used both during programming of the device and during normal operation of the device after programming of the device.

6. A method of claim 5, wherein the gate or base control electrode is connected to a high voltage, above ground potential to cause it to go into snapback mode.

7. A method of claim 6, wherein the high voltage to the gate or base control electrode is applied as a pulse.

8. A method of claim 5, wherein the anode of the device is connected to VDD through the resistor to provide a high output node between the anode and the resistor prior to programming, and a low output node once the device has gone into irreversible snapback mode.

9. A method of claim 8, wherein the output node is connected to an inverter to provide an inverted, buffered output.

* * * * *